(12) United States Patent
Shiraishi

(10) Patent No.: US 7,308,390 B2
(45) Date of Patent: Dec. 11, 2007

(54) METHOD AND APPARATUS FOR ESTIMATING TIRE/WHEEL PERFORMANCE BY SIMULATION

(75) Inventor: Masaki Shiraishi, Kobe (JP)

(73) Assignee: Sumitomo Rubber Industries, Ltd., Kobe-shi (JP)

(*) Notice: Subject to any disclaimer, the term of this patent is extended or adjusted under 35 U.S.C. 154(b) by 874 days.

(21) Appl. No.: 10/154,832

(22) Filed: May 28, 2002

(65) Prior Publication Data
US 2002/0177976 A1 Nov. 28, 2002

(30) Foreign Application Priority Data
May 28, 2001 (JP) .............................. 2001-159525

(51) Int. Cl.
*G06G 7/48* (2006.01)
(52) U.S. Cl. ......................................... 703/8
(58) Field of Classification Search ..................... 703/8
See application file for complete search history.

(56) References Cited

U.S. PATENT DOCUMENTS

| | | | | |
|---|---|---|---|---|
| 5,930,155 | A * | 7/1999 | Tohi et al. ...................... | 703/8 |
| 6,083,268 | A * | 7/2000 | Kelsey et al. ................... | 703/7 |
| 6,199,026 | B1 * | 3/2001 | Shiraishi et al. ............ | 702/140 |

FOREIGN PATENT DOCUMENTS

| | | | |
|---|---|---|---|
| EP | 0 919 941 A2 | 6/1999 |
| EP | 0 919 941 A2 | 6/1999 |
| EP | 0 919 941 A3 | 6/1999 |

OTHER PUBLICATIONS

H. Volk, *993 Kautschuk & Gummi Kunststoffe*, vol. 47, No. 10, (Oct. 1, 1994), pp. 739-740, 742-743. XP000468143.

Volk H., "Einsatz der Finiten Element Methode bei der Auslegung und Optimierung von Reifen", Kautschuk und Gummi-Kunststoffe, vol. 47, 1994, pp. 739-740, 742-743, XP000468143.

Tseng N T et al., "Numerical Stimulation For the Tire-Rim Interface for a Radial Passenger Tire", SAE Transactions, Society of Automotive Engineers, INC., No. 98, 1989, XP008051324.

* cited by examiner

*Primary Examiner*—Paul Rodriguez
*Assistant Examiner*—Russ Guill
(74) *Attorney, Agent, or Firm*—Birch, Stewart, Kolasch & Birch, LLP

(57) ABSTRACT

A method and an apparatus for estimating tire/wheel performance by simulation is disclosed, wherein a tire/wheel assembly model of an assembly of a wheel and a tire mounted thereon is made, and a simulation of the tire/wheel assembly model rolling under a given condition is carried out to obtain an estimated data indicating performance or a characteristic of the tire, wheel or the assembly. Preferably, the tire/wheel assembly model is made through a simulation of mounting a tire model on a wheel model, taking a friction into consideration. Also, the rolling simulation is carried out taking a friction between the tire beads and wheel rim into consideration.

10 Claims, 25 Drawing Sheets

Cornering Force

METHOD AND APPARATUS FOR ESTIMATING TIRE/WHEEL PERFORMANCE BY SIMULATION

The present invention relates to a method and apparatus in which a rolling simulation of a tire/wheel assembly is made and performance or characteristics of the tire, wheel and/or assembly can be estimated.

In U.S. Pat. No. 6,199,026, a simulation of a rolling tire using a finite element method is disclosed, wherein, in order to simulate a pneumatic tire mounted on a wheel rim, as shown in FIG. 25, the bead width w of a tire model (a) is set up to at a constant value equal to the rim width, and a surface (b) of the bead portions which comes into contact with the wheel rim is restrained not to change its relative position to the tire axis CL with respect to both the direction of the tire axis CL and the normal direction (r) to the tire axis.

In actuality, however, a tire is mounted on a wheel, and the engaging force therebetween depends on various factors, and the driving force and braking force is transmitted to the tire through the wheel. Therefore, it is desirable that total performance of the tire/wheel assembly is estimated in consideration of various factors such as the friction and slippage between the tire and wheel.

It is an object of the present invention to provide a method and apparatus for estimating tire/wheel performance by simulation, in which a finite element model of an assembly of a tire and a wheel is used, and accurate simulation of a rolling tire or a tire/wheel assembly is possible, and thereby accurate performance or characteristic estimation is possible.

According to one aspect of the present invention, a method for estimating tire/wheel performance by simulation comprises forming a tire/wheel assembly model which is a finite element model of an assembly of a wheel and a tire mounted thereon, simulating the tire/wheel assembly model which is rolling under a given rolling condition, and getting an estimated value which indicates performance or a characteristic of the tire, wheel or the assembly, from the rolling simulation.

An embodiment of the present invention will now be described in detail in conjunction with the accompanying drawings.

Figure 11A:
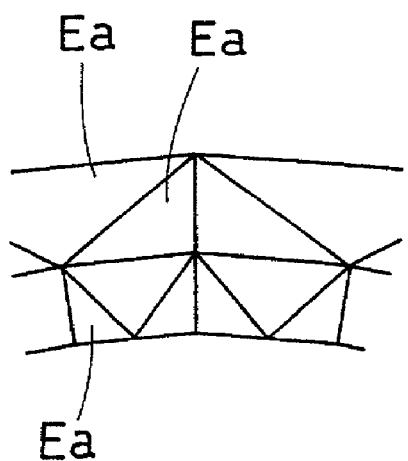
Figure 11B:
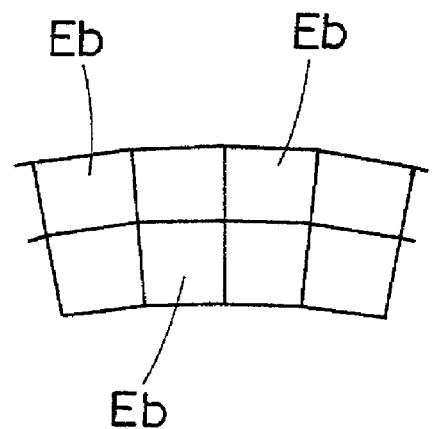

FIGS. 11(A) and 11(B) shows modeling using tetrahedral elements and hexahedral elements.

Figure 12:
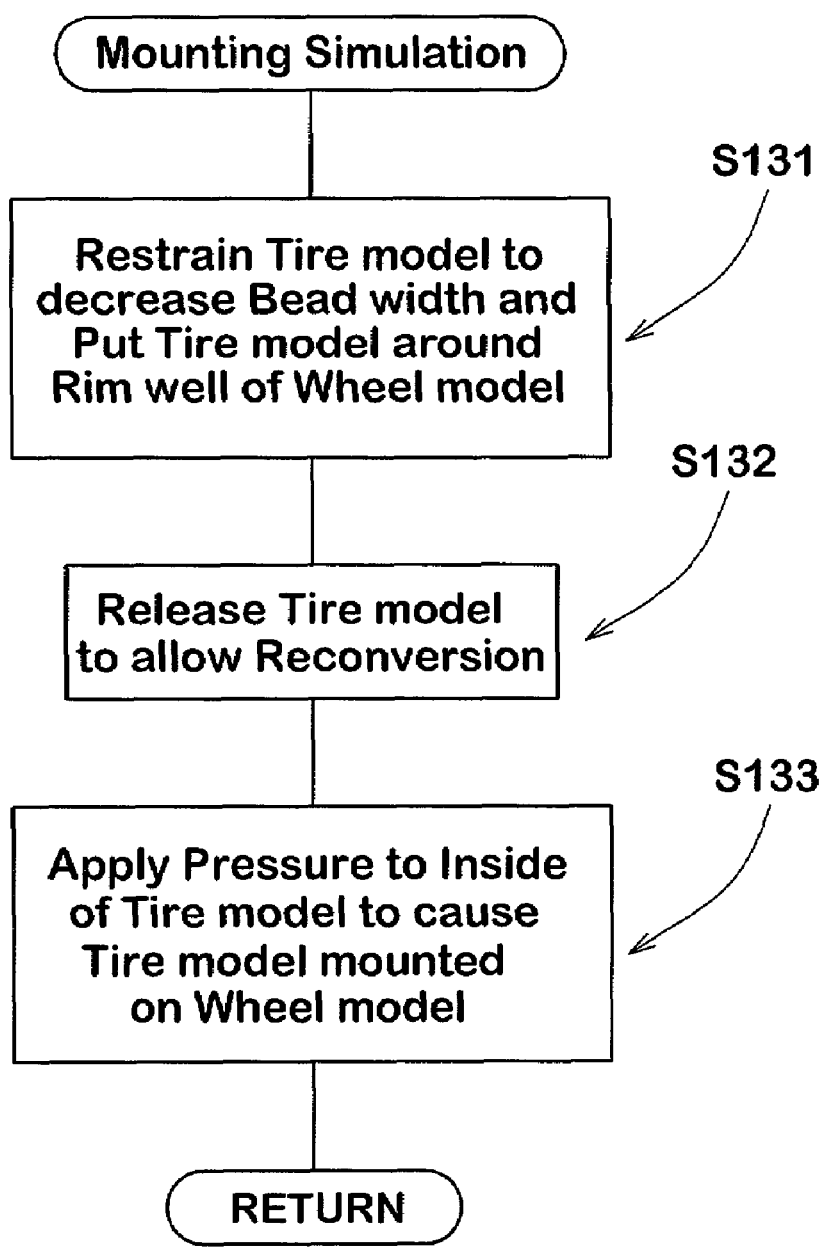

FIG. 12 is a flowchart of a tire mounting simulation.

Figure 13:
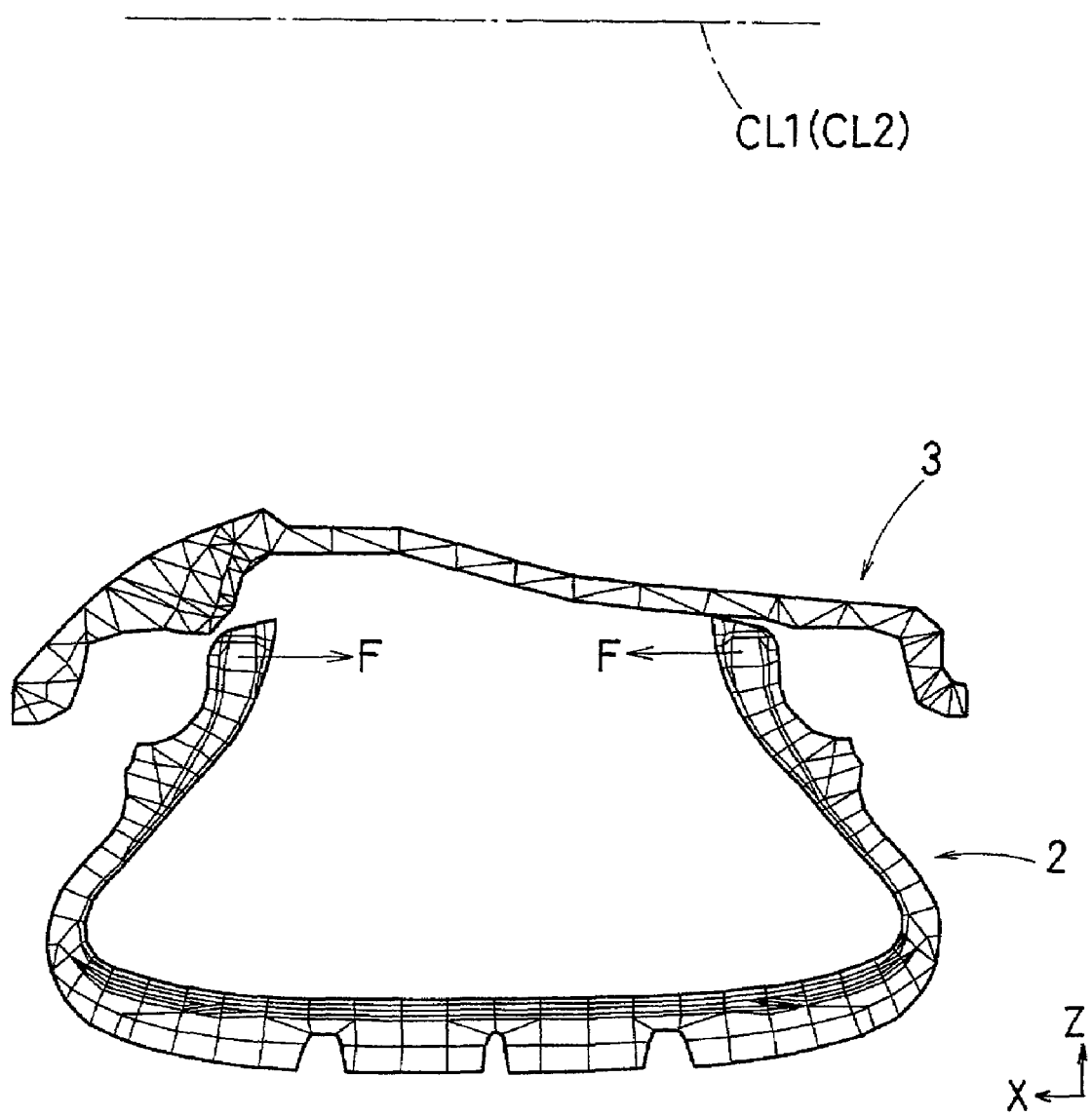

FIG. 13 shows a transitional state that the tire model is not yet completely mounted on the wheel model.

Figure 14:
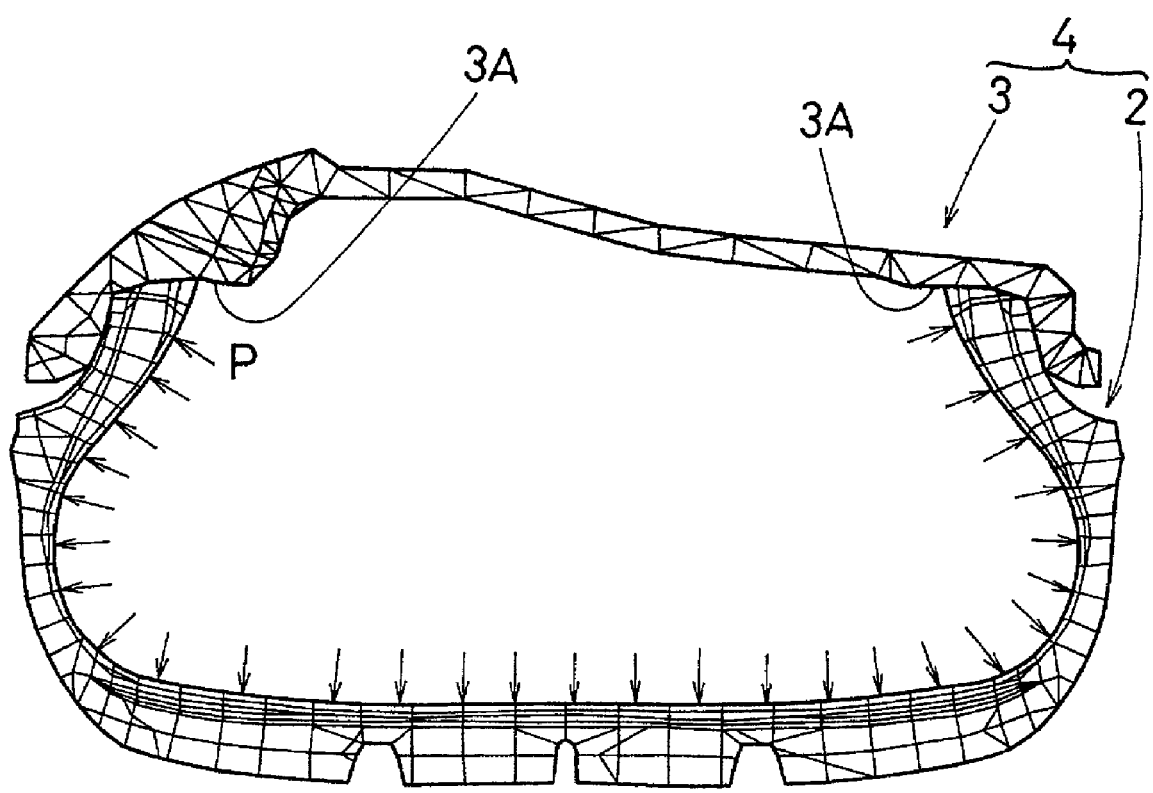

FIG. 14 shows a state that the tire model is completely mounted on the wheel model.

Figure 15:
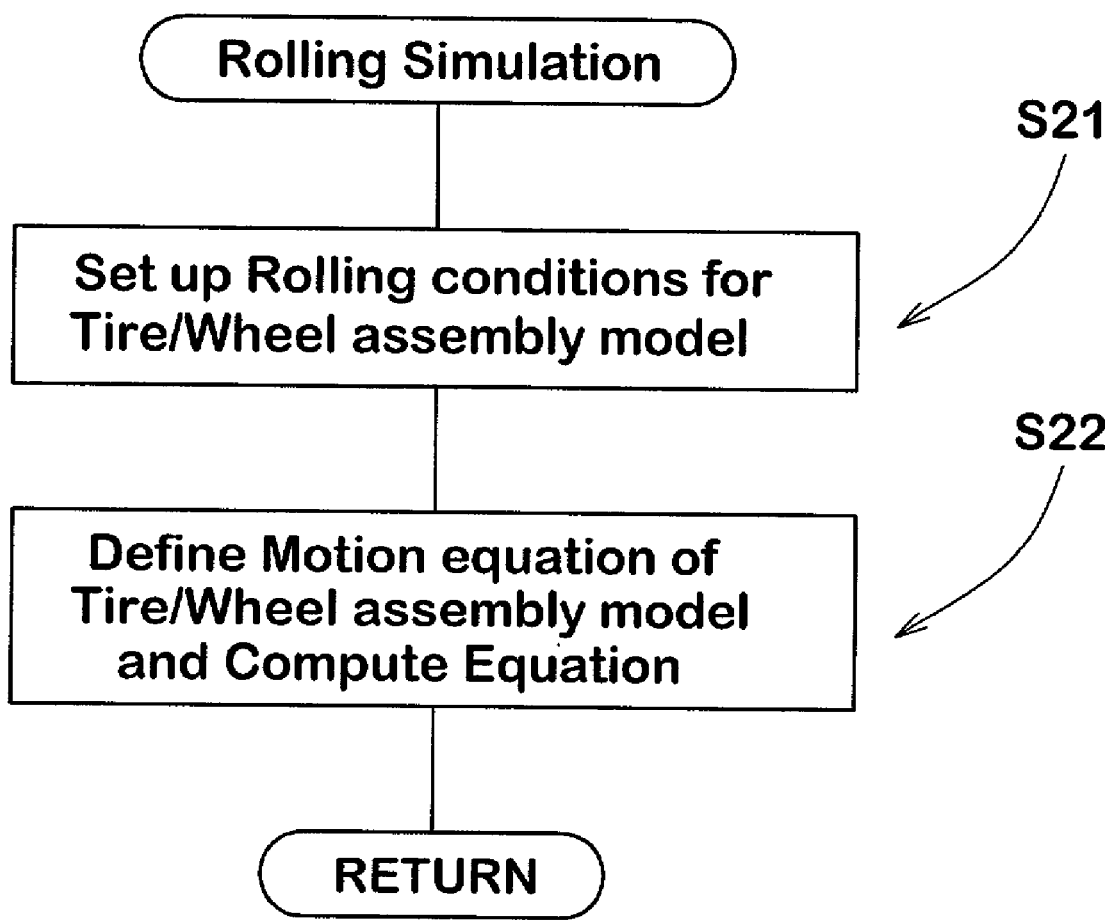

FIG. 15 is a flowchart of a rolling simulation.

Figure 16:
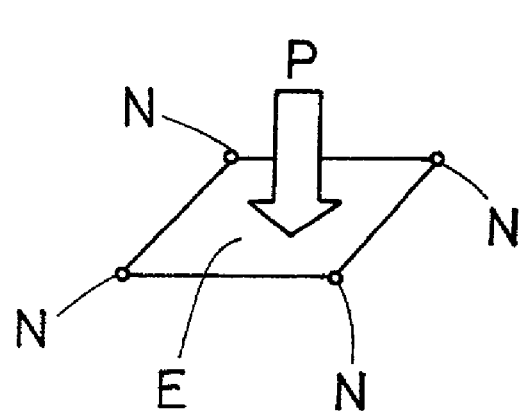
Figure 16:
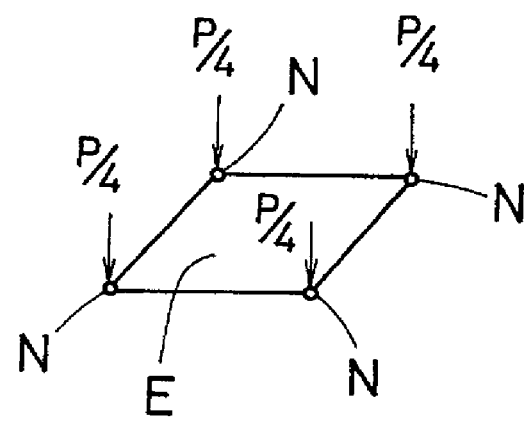

FIG. 16 is a diagram for explaining how a pressure to an element surface is distributed to the nodes.

Figure 17A:
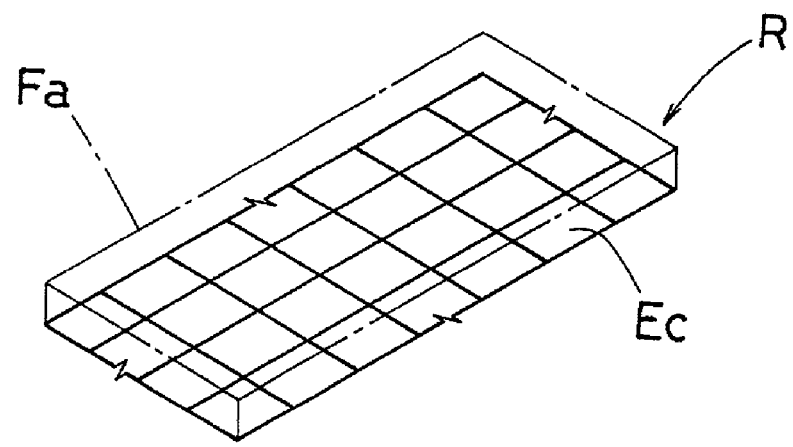
Figure 17B:
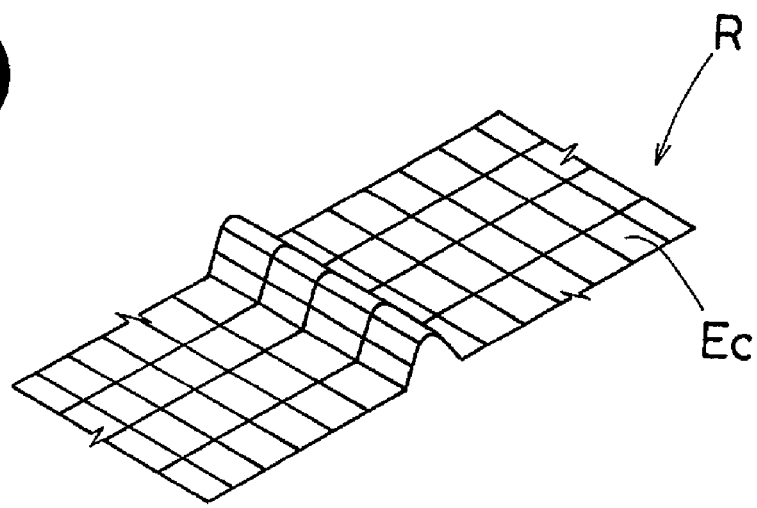

FIGS. 17(A) and 17(B) each show a model of a road surface.

Figure 18:
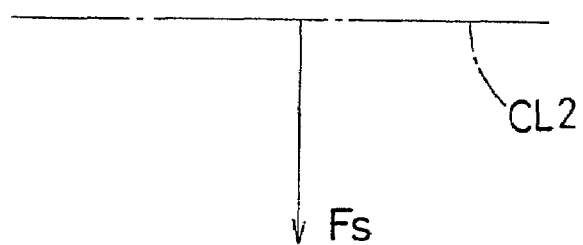
Figure 18:
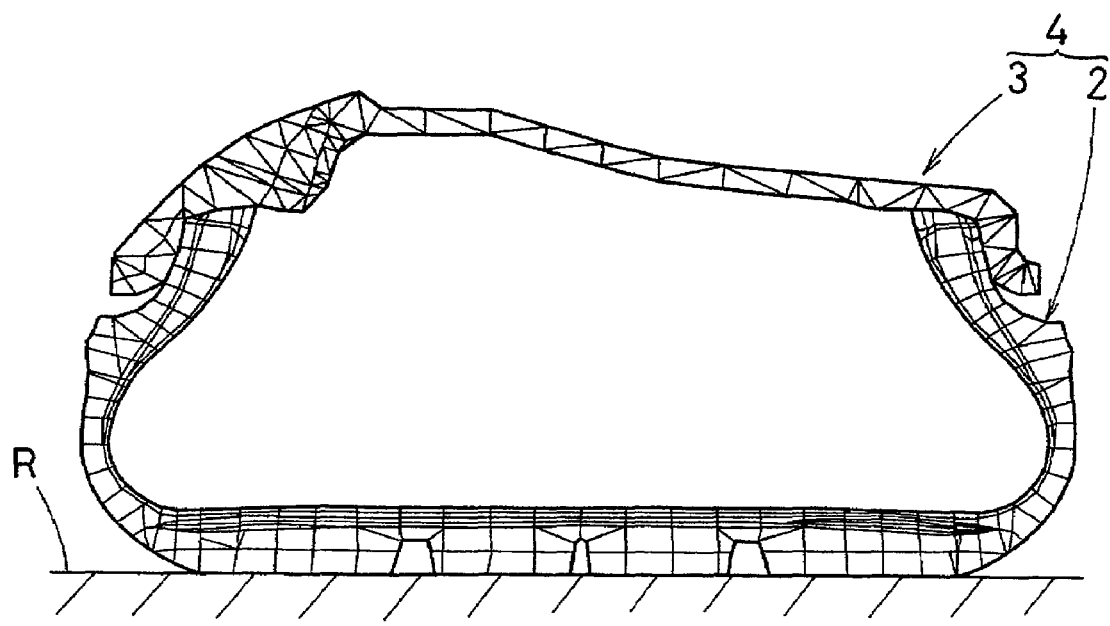

FIG. 18 shows a state that the tire model which is mounted on the wheel model and inflated and loaded contacts with a road surface.

Figure 19:
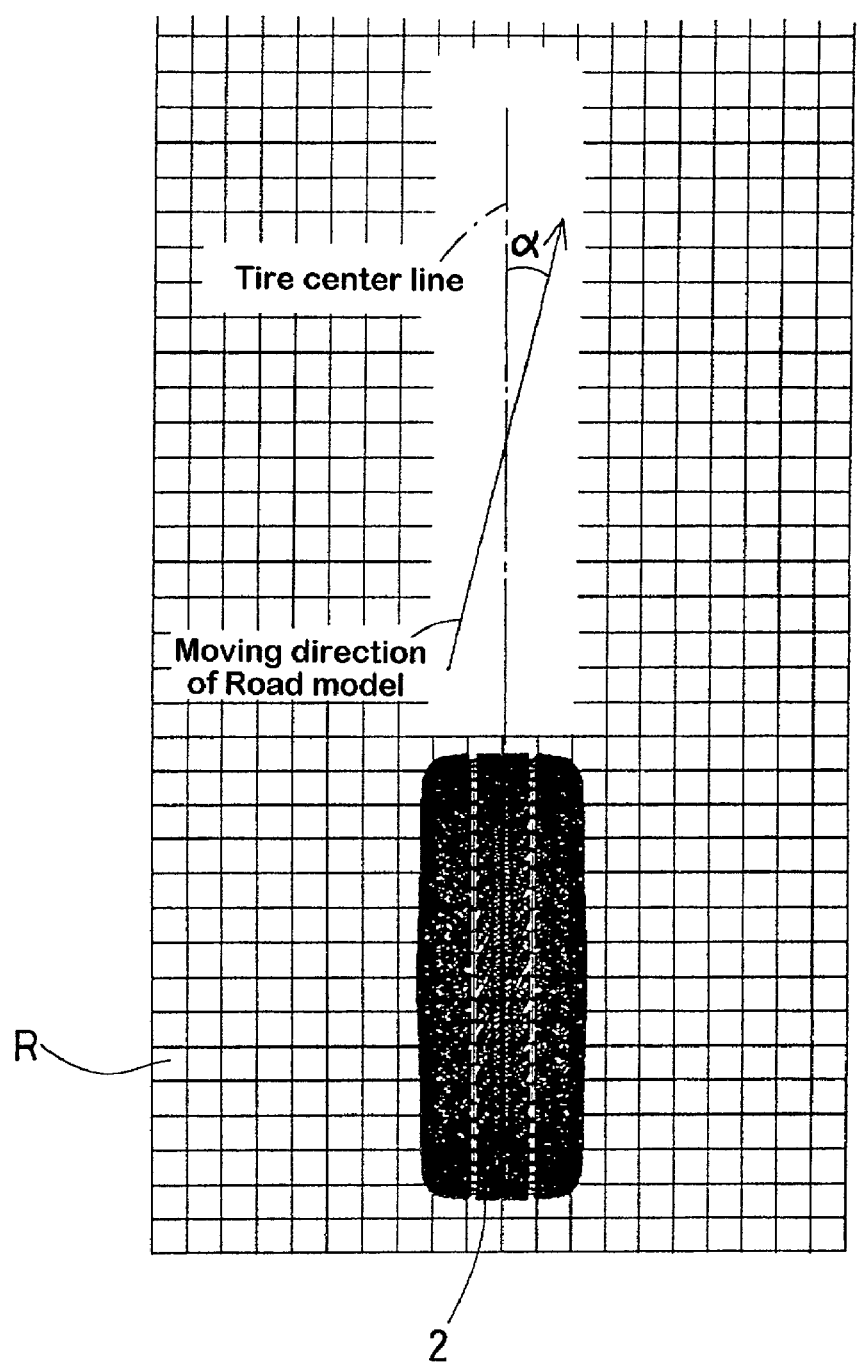

FIG. 19 is a plan view for explaining a slip angle.

Figure 20:
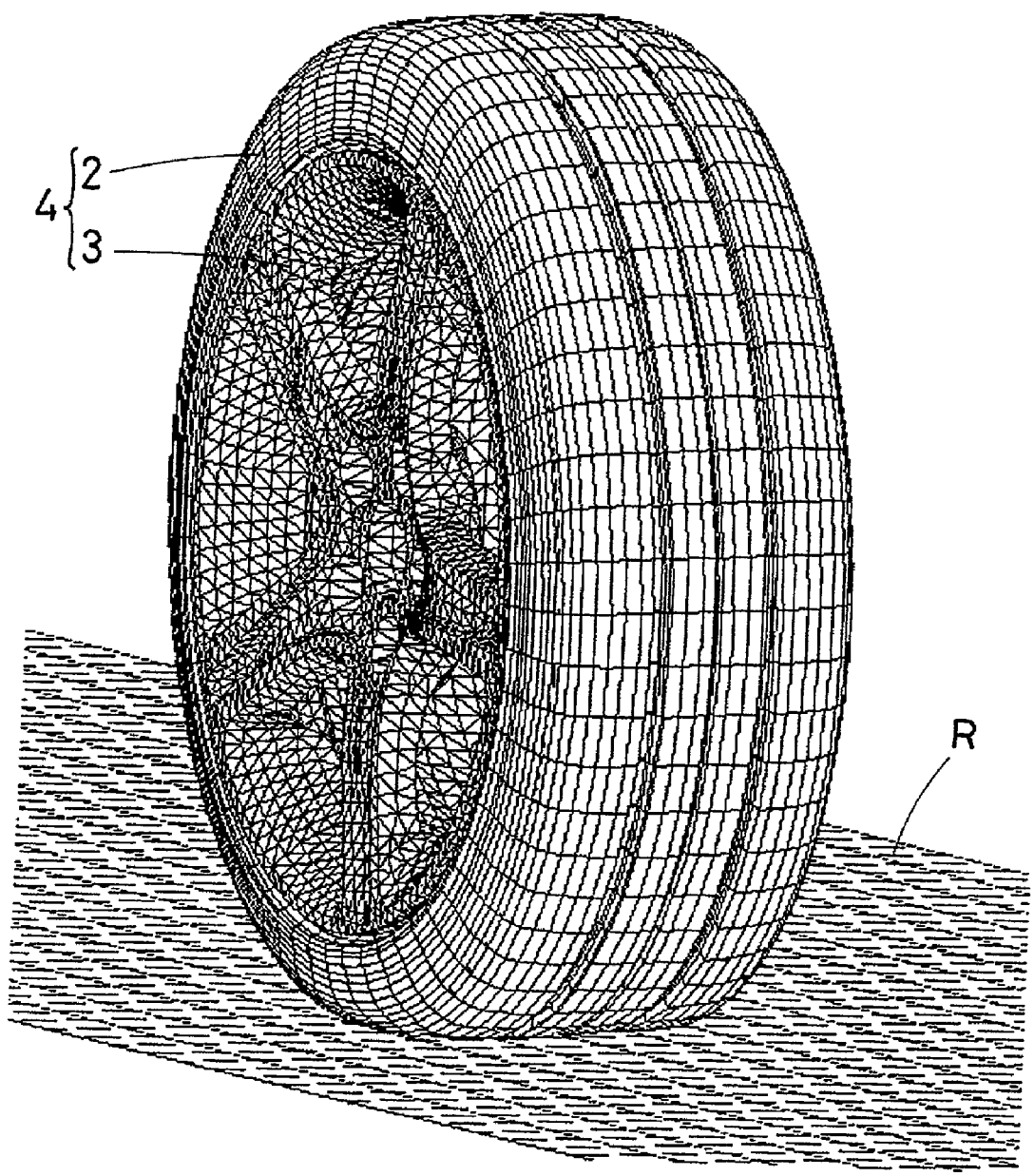

FIG. 20 shows a scene of the rolling simulation wherein the tire/wheel assembly model is rolling on a road model.

Figure 21:
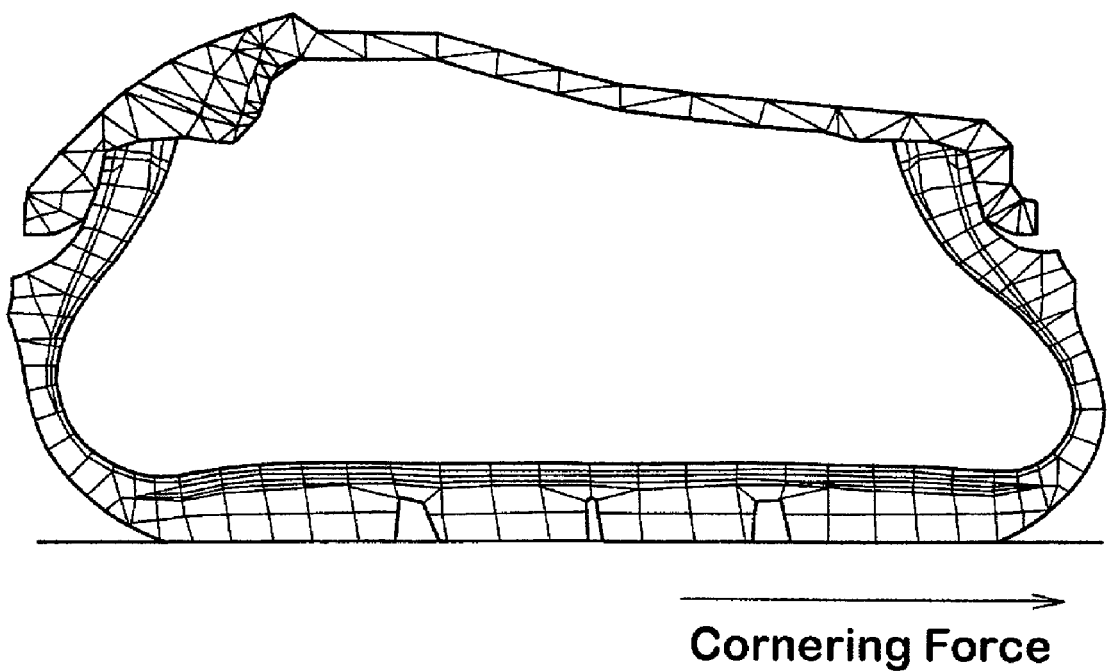

FIG. 21 shows a cross section of the tire/wheel assembly model during cornering simulation.

Figure 22:
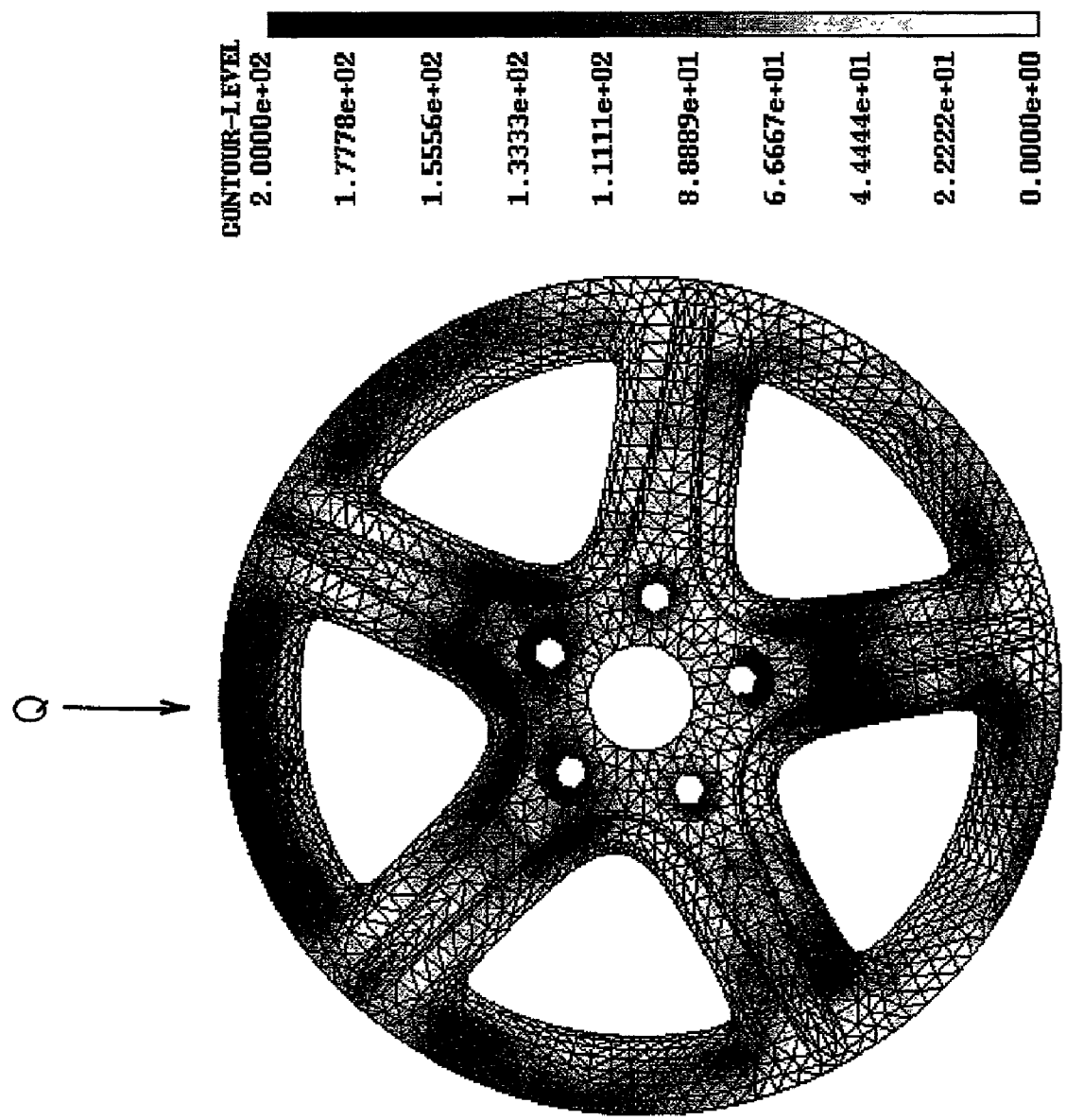
Figure 23:
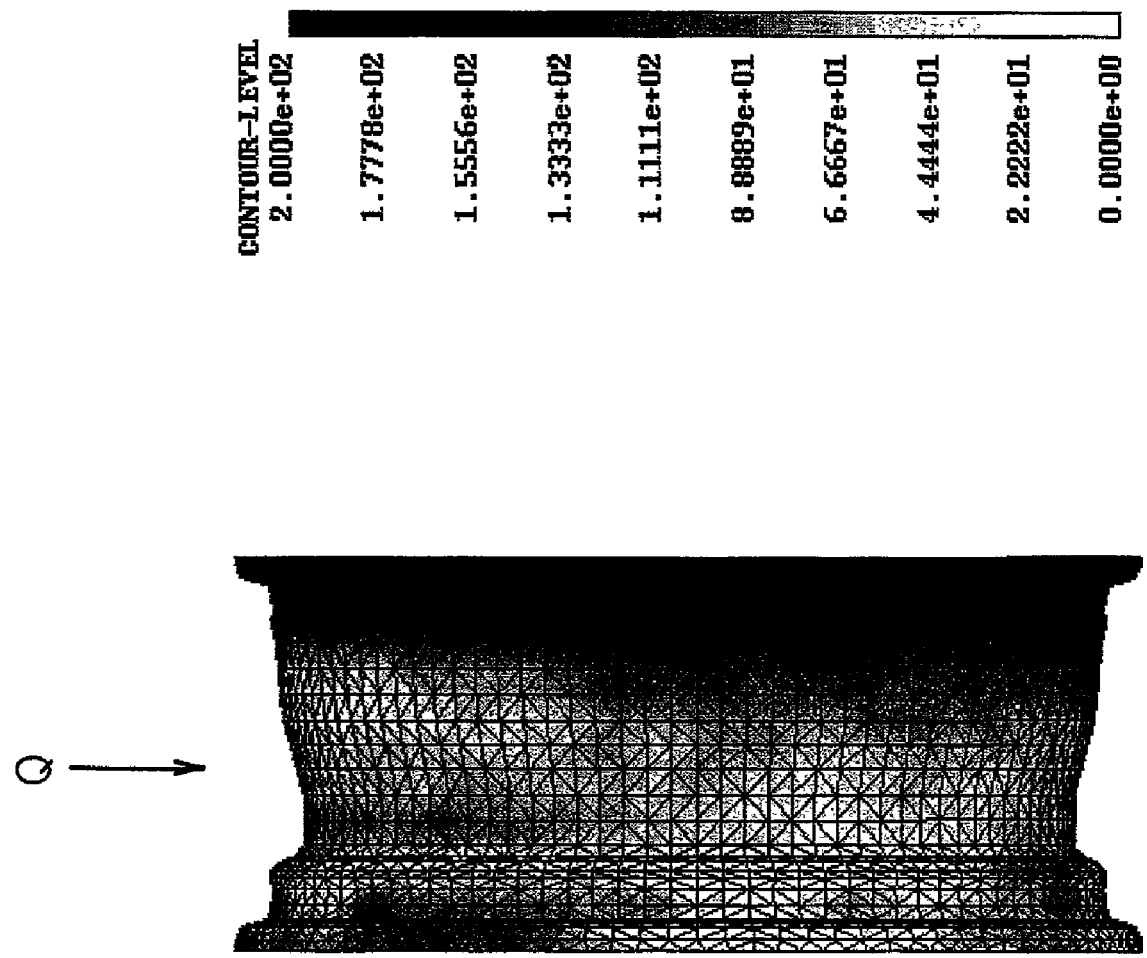
Figure 24:
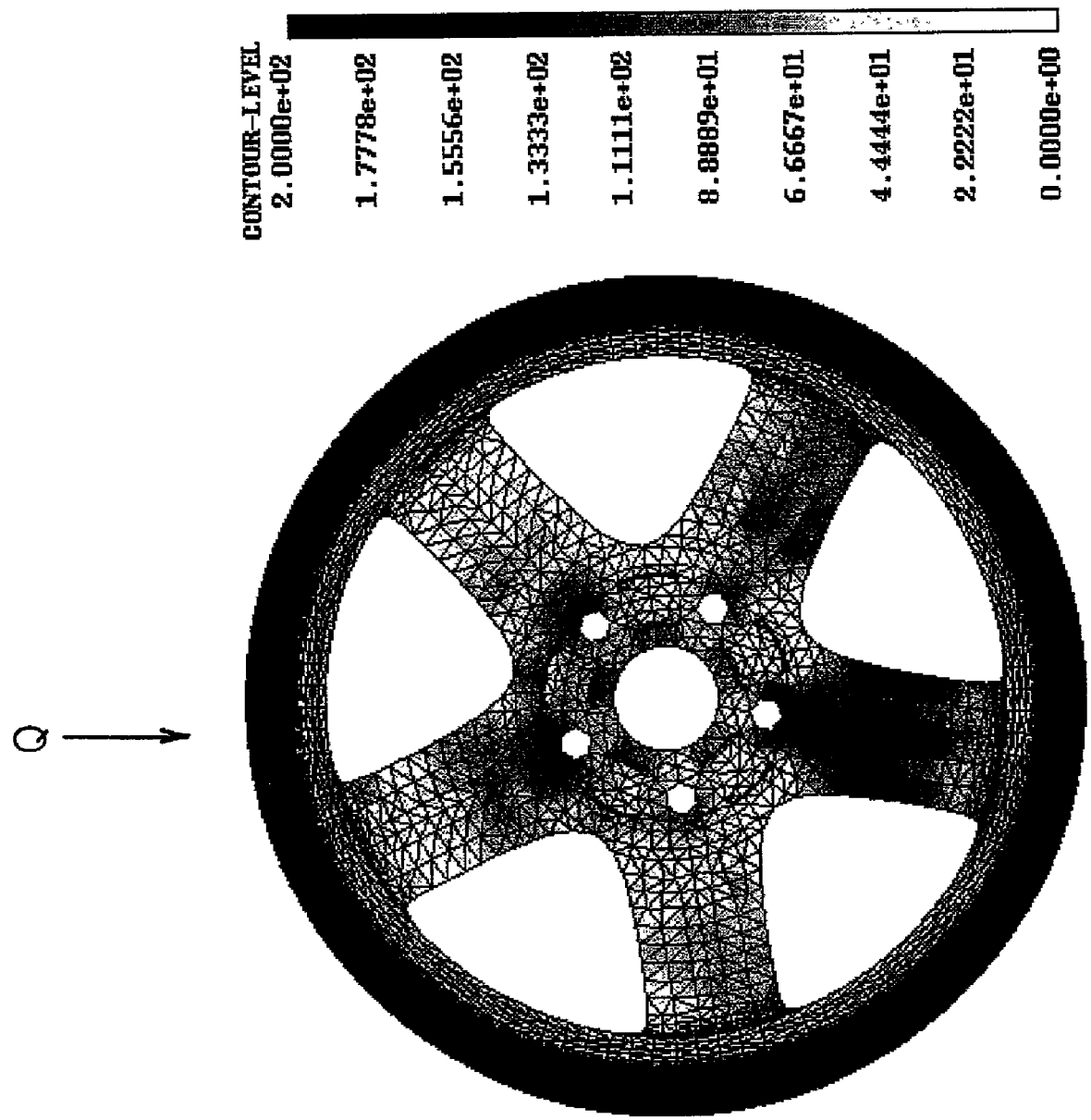

FIGS. 22, 23 and 24 each show a stress distribution of a wheel model during cornering.

Figure 25:
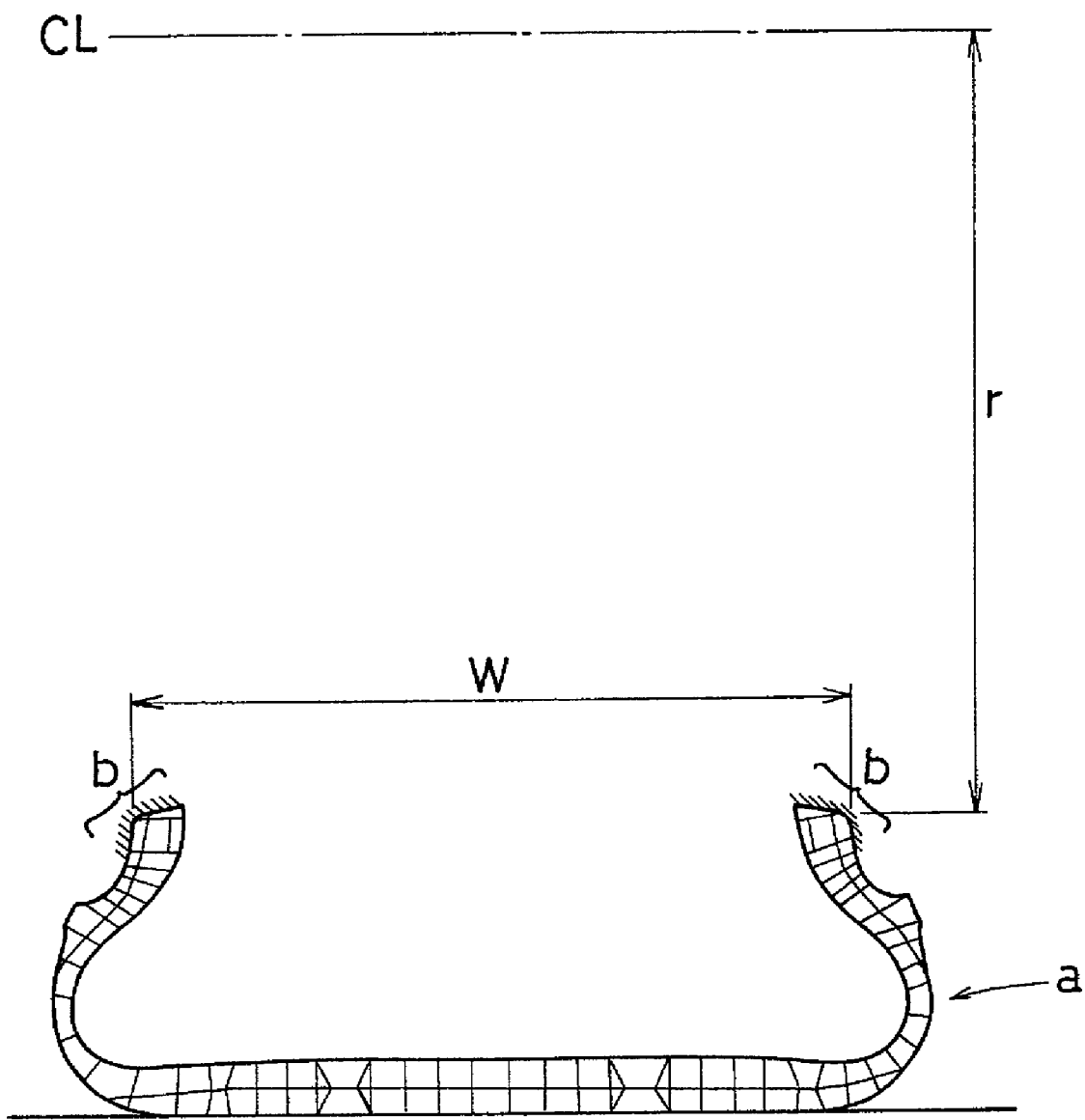

FIG. 25 is a diagram for explaining a method of mounting a tire model on a wheel rim according to the prior art.

Figure 1:
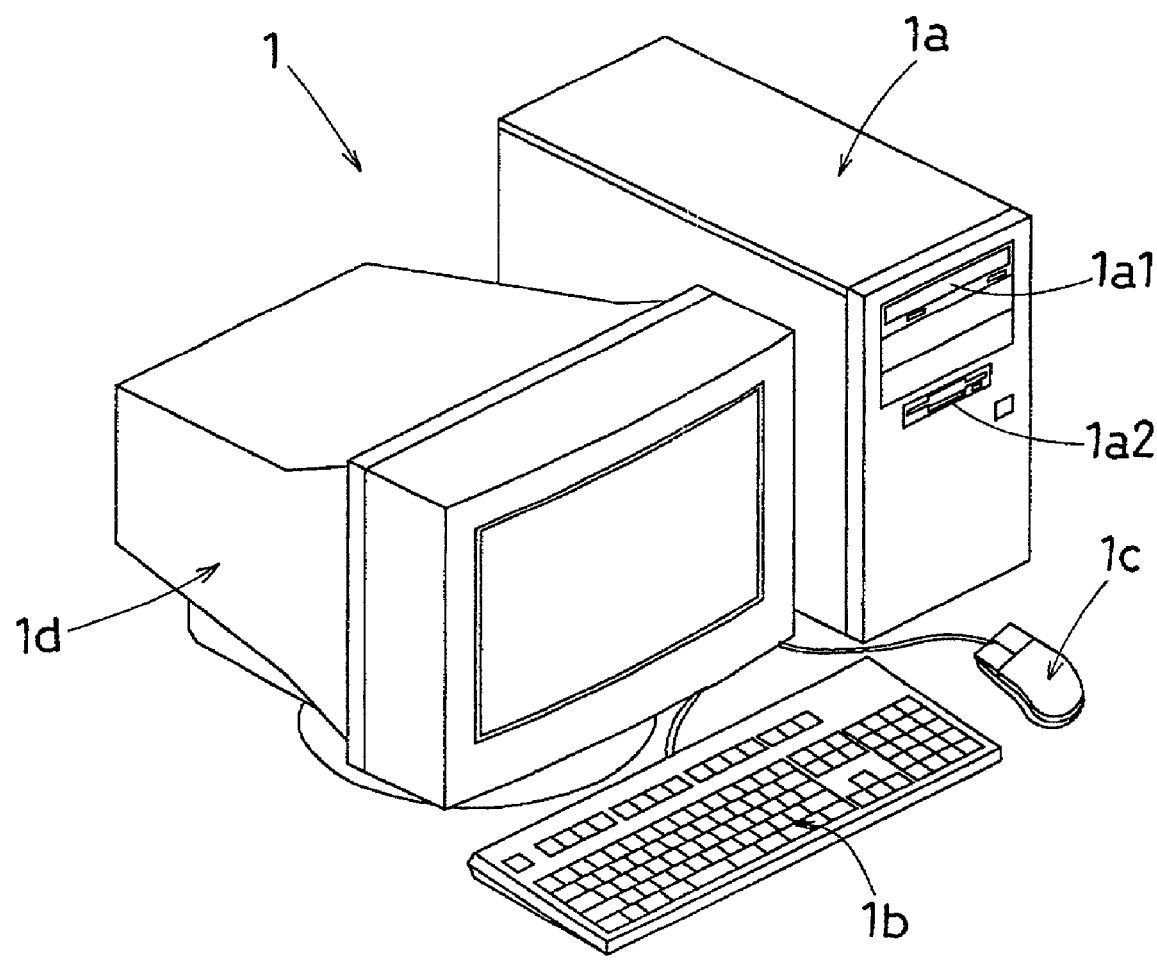
FIG. 1 shows an apparatus for estimating tire/wheel performance according to the present invention.

FIG. 1 shows an apparatus 1 according to the present invention which can simulate a rolling tire/wheel assembly and estimate performance and characteristics of the tire, wheel and assembly. In this embodiment, a general-purpose computer system is used as the apparatus 1. The computer system comprises a keyboard 1b as an input device, a mouse 1c as a pointing device, a display 1d as an output device, a CPU, memory, mass storage device, e.g. a hard disk, floppy drive 1a2, CD drive 1a1, printer and the like. The undermentioned simulation programs, evaluation programs and the like are stored in a mass storage device. Data relating to the tire, wheel, road and the like and simulation conditions are inputted and stored in the storage device.

Figure 2:
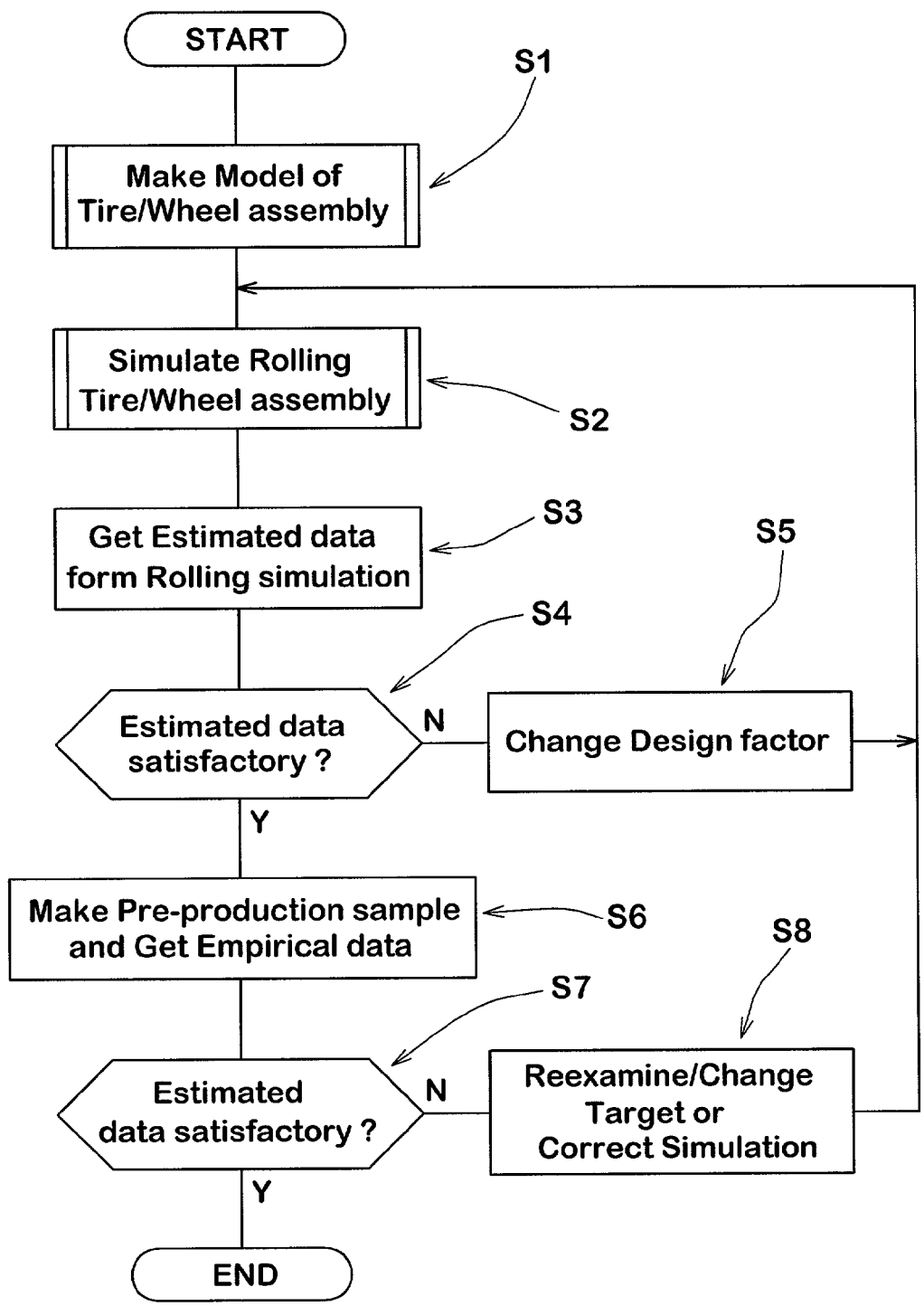
FIG. 2 is a flowchart of a tire development in which a method for estimating tire/wheel performance according to the present invention is incorporated.

FIG. 2 shows an example of tire/wheel development procedure in which a method for estimating tire/wheel performance by simulation according to the present invention is incorporated.

The tire/wheel development procedure will now be described in detail in the order of events.

In this procedure, firstly, a model of an assembly of a tire and a wheel to be estimated (hereinafter, the "tire/wheel assembly model") is made. (Process S1)

Figure 3:
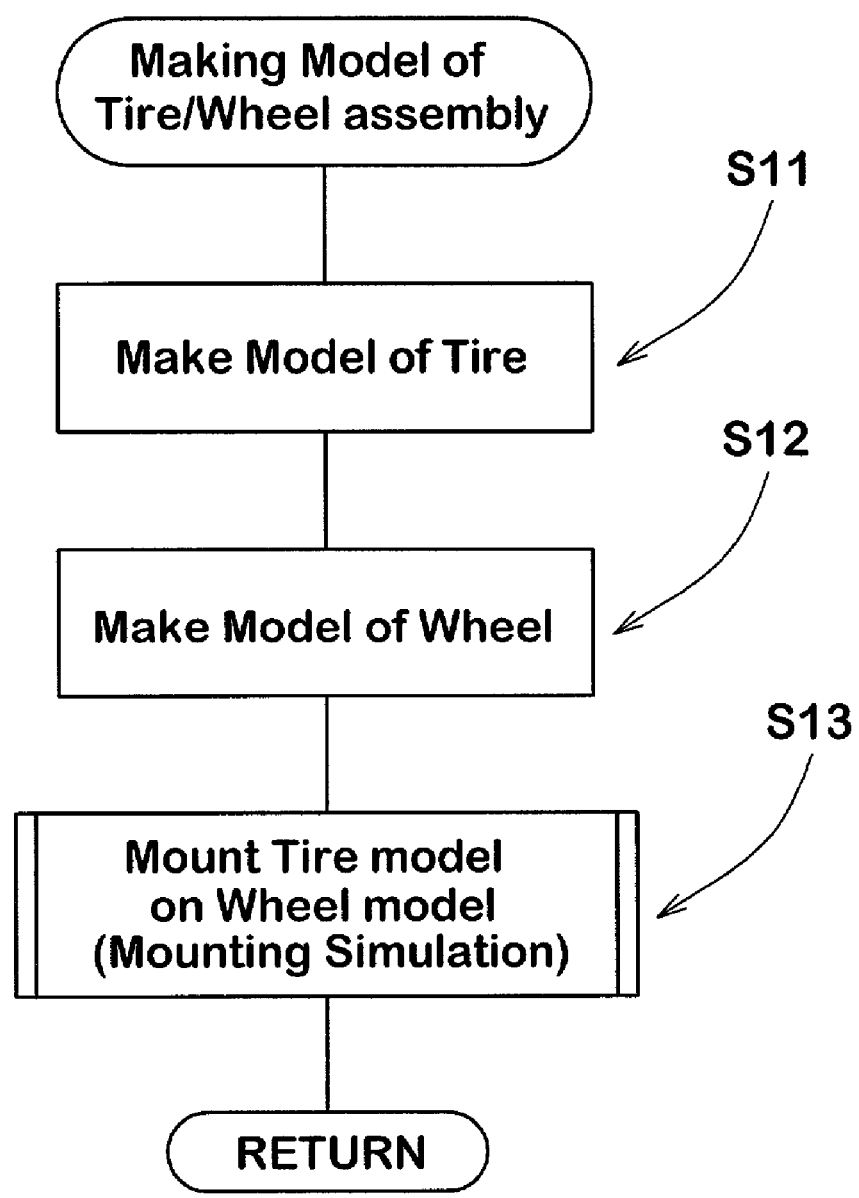
FIG. 3 is a flowchart for producing a tire/wheel assembly model.

FIG. 3 shows an example of the subroutine for making the tire/wheel assembly model, wherein the tire is divided into finite elements $2a$, $2b$, $2c$ - - - from which a model (tire model) of the tire is formed. (Process S11)

Figure 4:
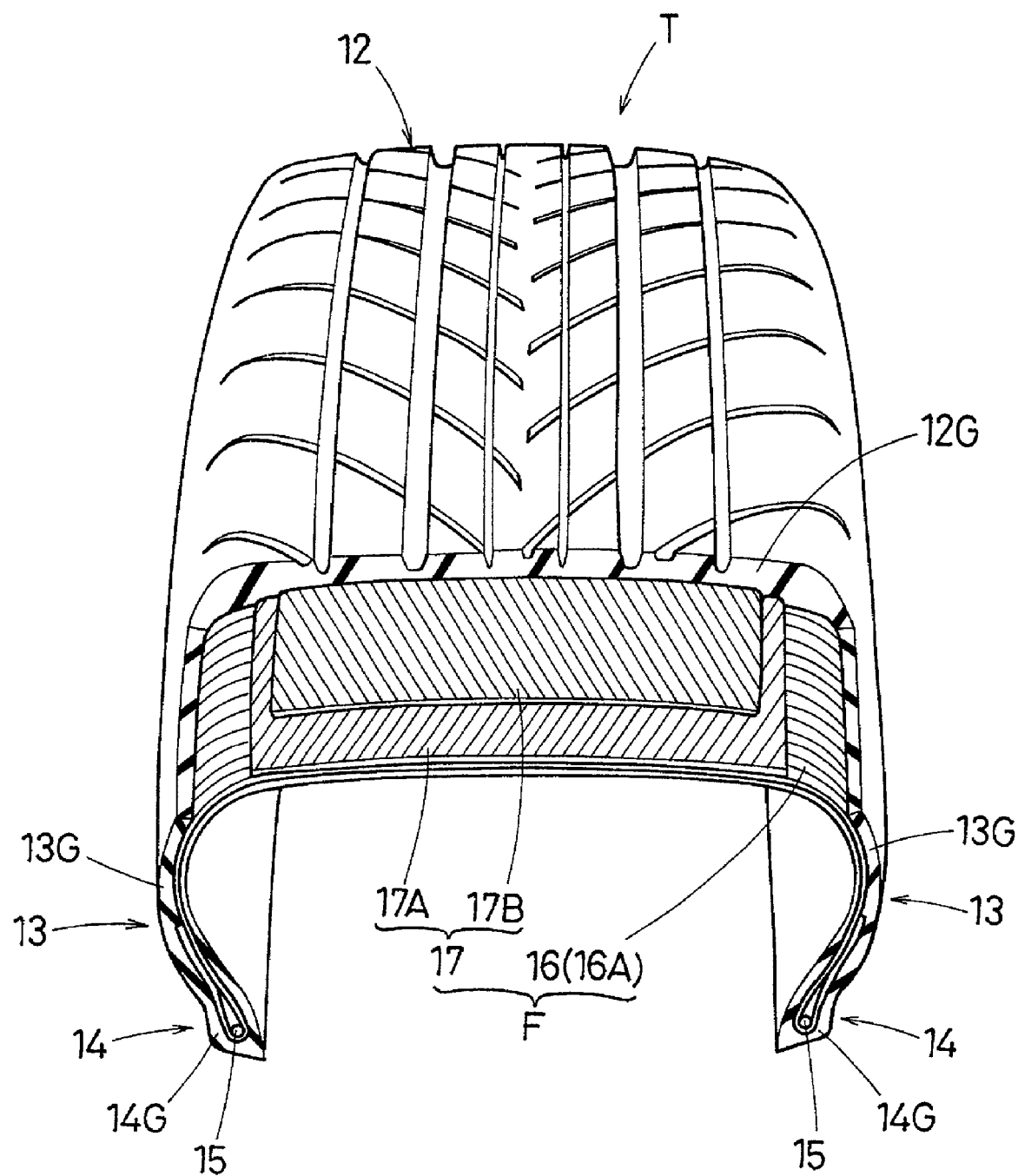
FIG. 4 shows an exemplary inner structure of a pneumatic tire.

The tire in this example is a pneumatic tire T. FIG. 4 shows an exemplary internal structure of a pneumatic tire T, which comprises a tread portion 12, a pair of sidewall portions 13, a pair of bead portions 14 each with a bead core 15 therein, a carcass 16 comprising a carcass ply 16A, a belt 17 comprising two cross breaker plies 17A and 17B disposed radially outside the carcass 16, and rubber components including tread rubber 12G, sidewall rubber 13G, bead rubber 14G and the like.

The reinforcing cord layer such as carcass ply 16A, belt ply 17A, 17B and the like is a complex material F made up of reinforcing cords and topping rubber.

With respect to the elements $2a$, $2b$, $2c$ - - - of the tire model, coordinates of their nodes, shapes, material characteristics such as mass density, Young's modulus, damping coefficient and the like are defined.

Figure 5:
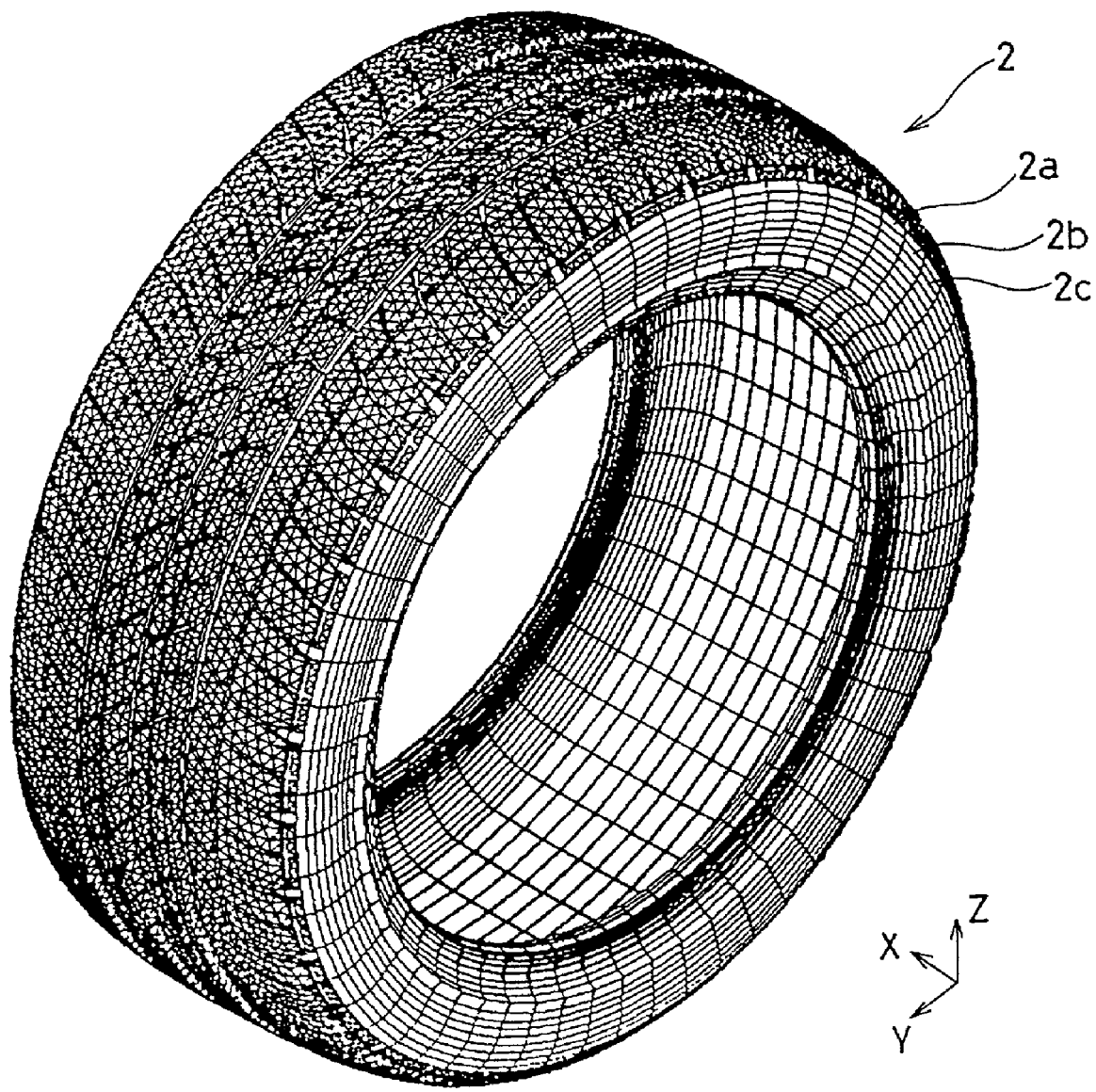
FIG. 5 shows a finite element model of a pneumatic tire.

FIG. 5 shows an exemplary tire model 2 of a pneumatic tire, wherein coordinate data relating to the finite elements $2a$, $2b$, $2c$ - - - are visualized in a three-dimensional manner by the computer system 1. As to the elements $2a$, $2b$, $2c$ - - - , various elements can be used therefore For example, two-dimensional elements such as quadrilateral element, three-dimensional elements such as tetrahedral solid element, pentahedral solid element, hexahedral solid element and the like are used according to the shape, material, characteristics of the object.

Figure 6:
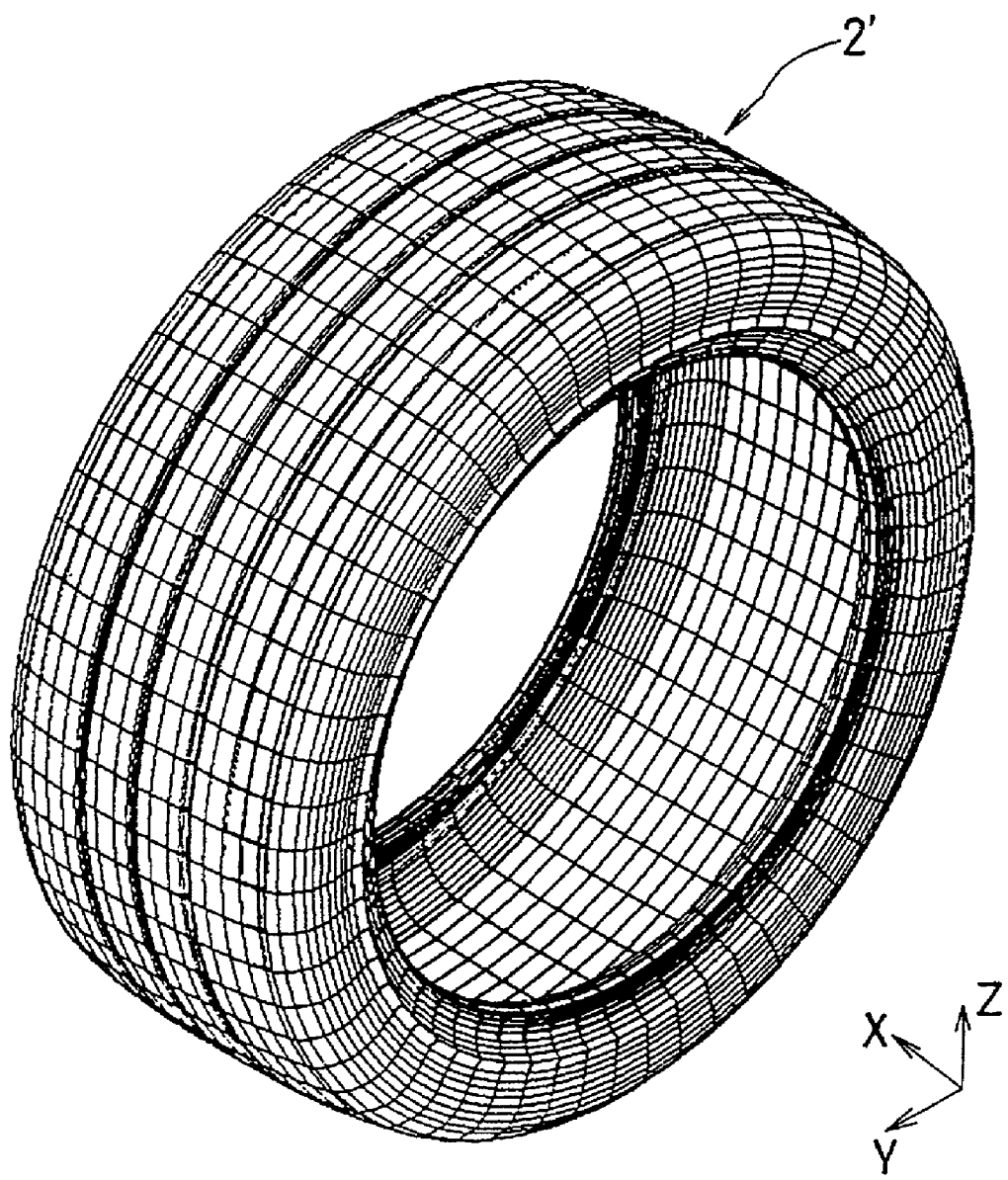
FIG. 6 shows a finite element model of the pneumatic tire.

For the rubber components, three-dimensional solid elements are usually used. In the tread rubber of the tire model shown in FIG. 5, the tread pattern or tread grooves such as circumferential grooves and axial grooves are truly modeled. However, if this is not so important, it is possible to omit some of the tread grooves or simplify the tread pattern like a tire model 2' shown in FIG. 6.

In anyway, in order that distributions of the ground pressure and shearing stress in the tread portion can be displayed precisely, the circumferential length of each element is preferably set in a range of not more than 25% of the ground contacting length of the tread portion in the tire circumferential direction. Further, in order that a curvature of the tread profile can be reproduced in the tire model, the axial width of each element is preferably set in a range of not more than 20 mm.

Figure 7:
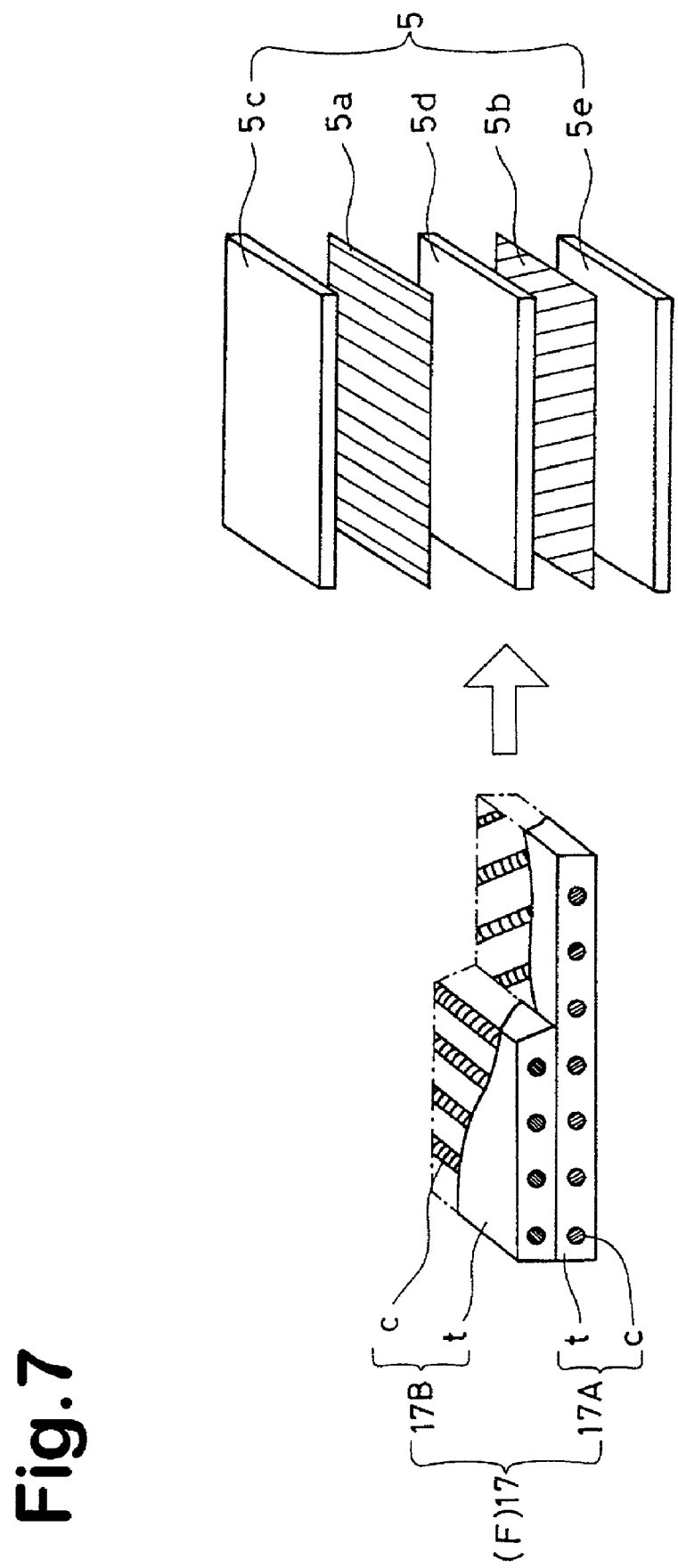
FIG. 7 is a diagram for explaining a model of a rubberized reinforcing cord layer as a complex material.

In case of a complex material F such as the belt (17A, 17B), as shown in FIG. 7, a part of cord array, that is, the parallel cords (c) and topping rubber therebetween, is modeled by a quadrilateral membrane element (5a,5b). The part of thin topping rubber (t) on each side of the cord array is modeled by a hexahedral solid element (5c, 5d, 5e). Thus, the belt 17 composed of a plurality of plies 17A and 17B is modeled by a complex shell element made of alternate solid elements and membrane elements, which is in this example formed by stacking a hexahedral solid element 5c, a quadrilateral membrane element 5a, a hexahedral solid element 5d, a quadrilateral membrane element 5b, a hexahedral solid element 5e in this order. With respect to the membrane element, defined are a thickness equal to the cord diameter and rigidity anisotropy such that rigidity is different between the cord oriented direction and the orthogonal direction thereto. The solid element is on the other hand, defined as a superviscoelastic material.

The method of dividing the tire into finite elements is not limited to a specific method as far as the kind, shape, property and the like of each element are appropriately selected as explained above. For example, the following method may be used as a simplified method of making the tire model 2. First, a two-dimensional shape of each element in a tire meridian section is defined. In other words, the cross sectional shape of the tire is divided into various shapes according to the parts, material, shapes and the like. Then, the two-dimensional shape is expanded in the circumferential direction by rotating around the tire axis at small angle intervals or short circumferential length intervals to make elements on a short circumferential length base.

In any case, in order to accurately grasp the mounted state of the tire bead portion and the wheel rim, the tire bead portion have to be elaborately divided into finite elements.

According to the subroutine shown in FIG. 3, on the other hand, the wheel is divided into finite elements from which a model of the wheel (hereinafter, the "wheel model" 3) is formed. (Process S12)

In this example, the wheel is a light-alloy wheel Wh, but it can be a wheel of steel or other material.

Figure 8:
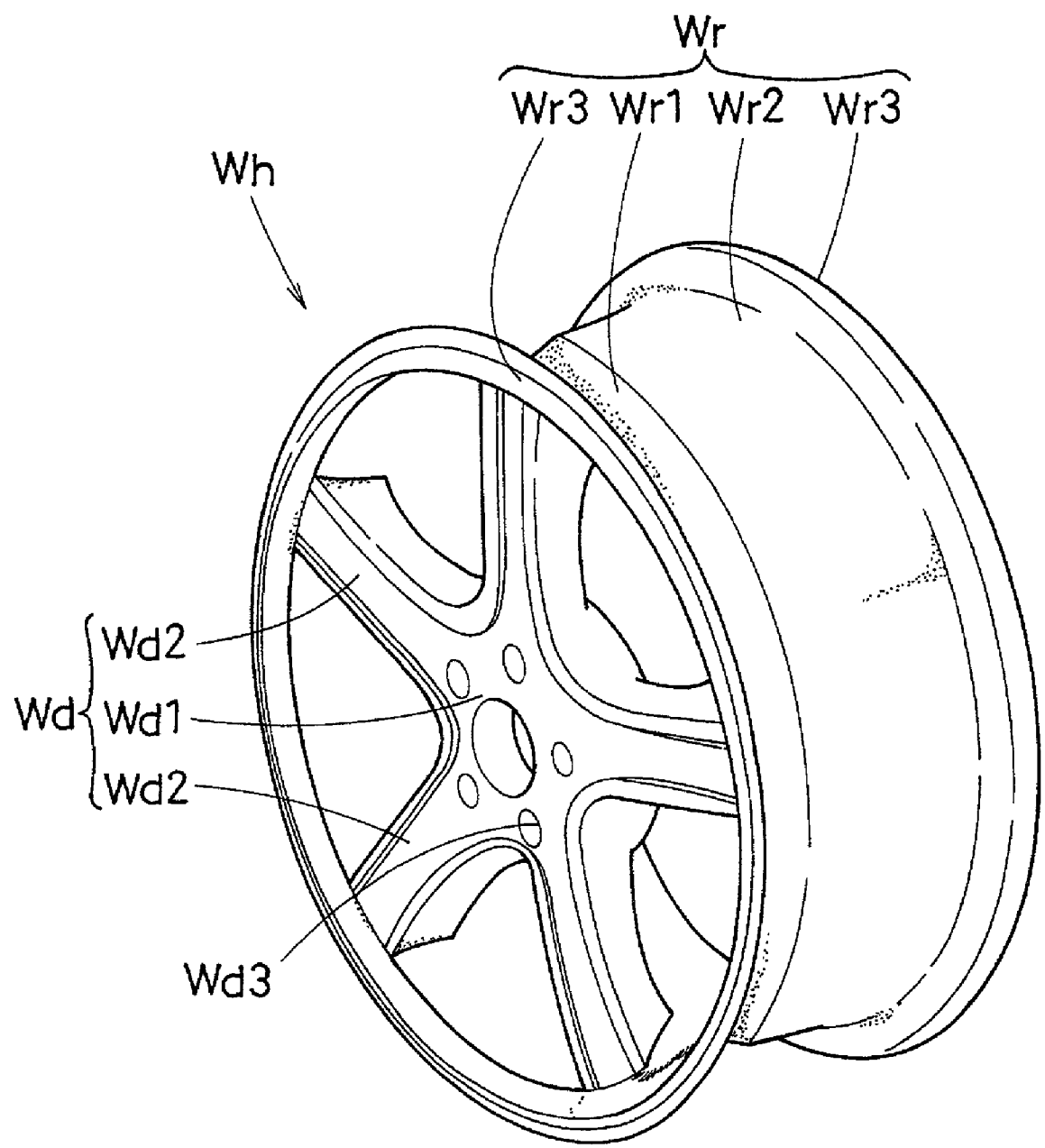
FIG. 8 shows an exemplary wheel on which a pneumatic tire is mounted.
Figure 9:
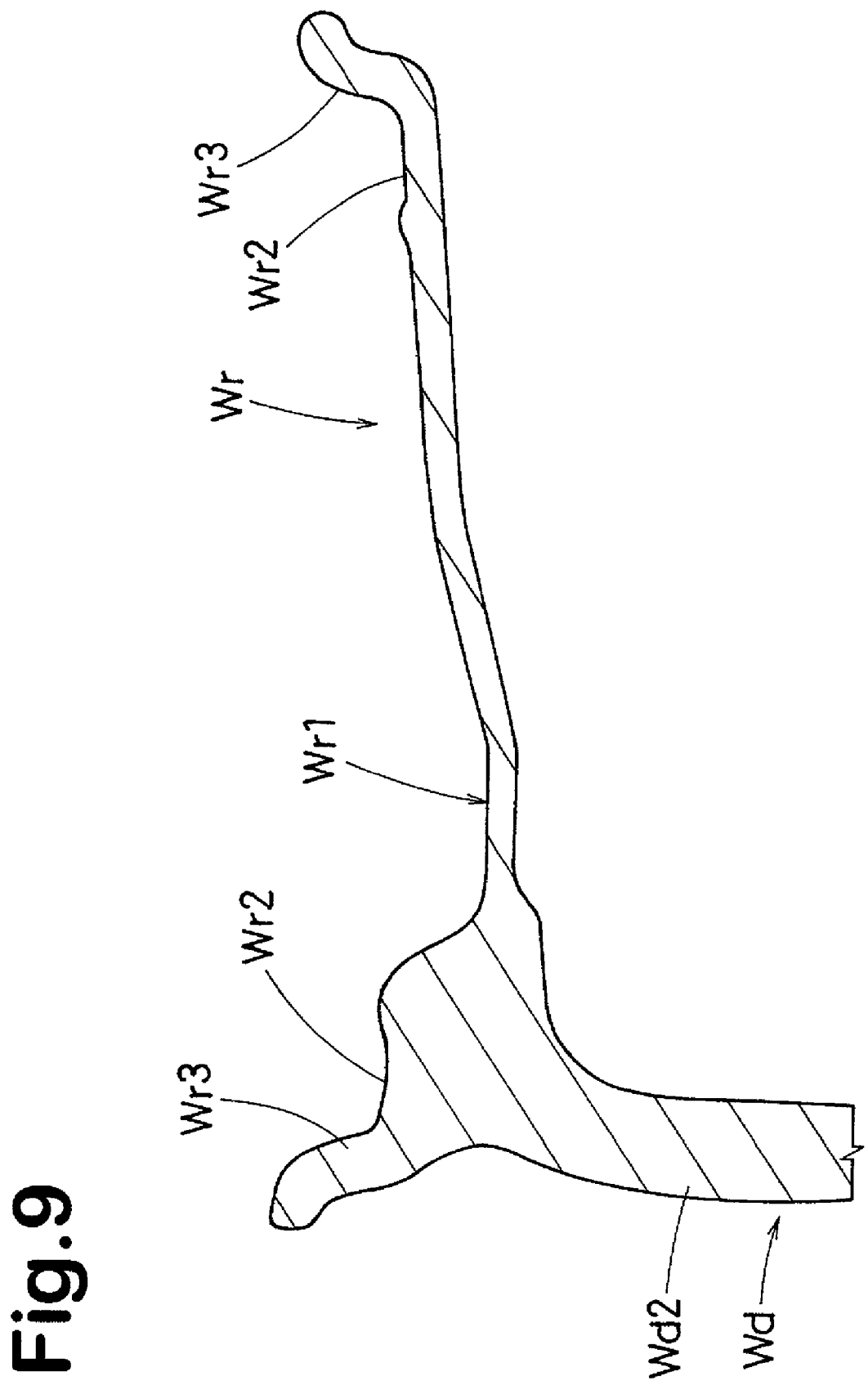
FIG. 9 is a cross sectional view of a rim part of the wheel.

FIG. 8 shows an example of the light-alloy wheel Wh, and a cross sectional partial view thereof is shown in FIG. 9. The wheel Wh comprises a rim portion Wr and a disk portion Wd. The rim portion Wr comprises a pair of bead seats Wr2, a rim well Wr1 therebetween and a pair of rim flanges Wr3. The disk portion Wd is made up of five spokes Wd2 and a hub Wd1 provided with bolt holes Wd.

Figure 10:
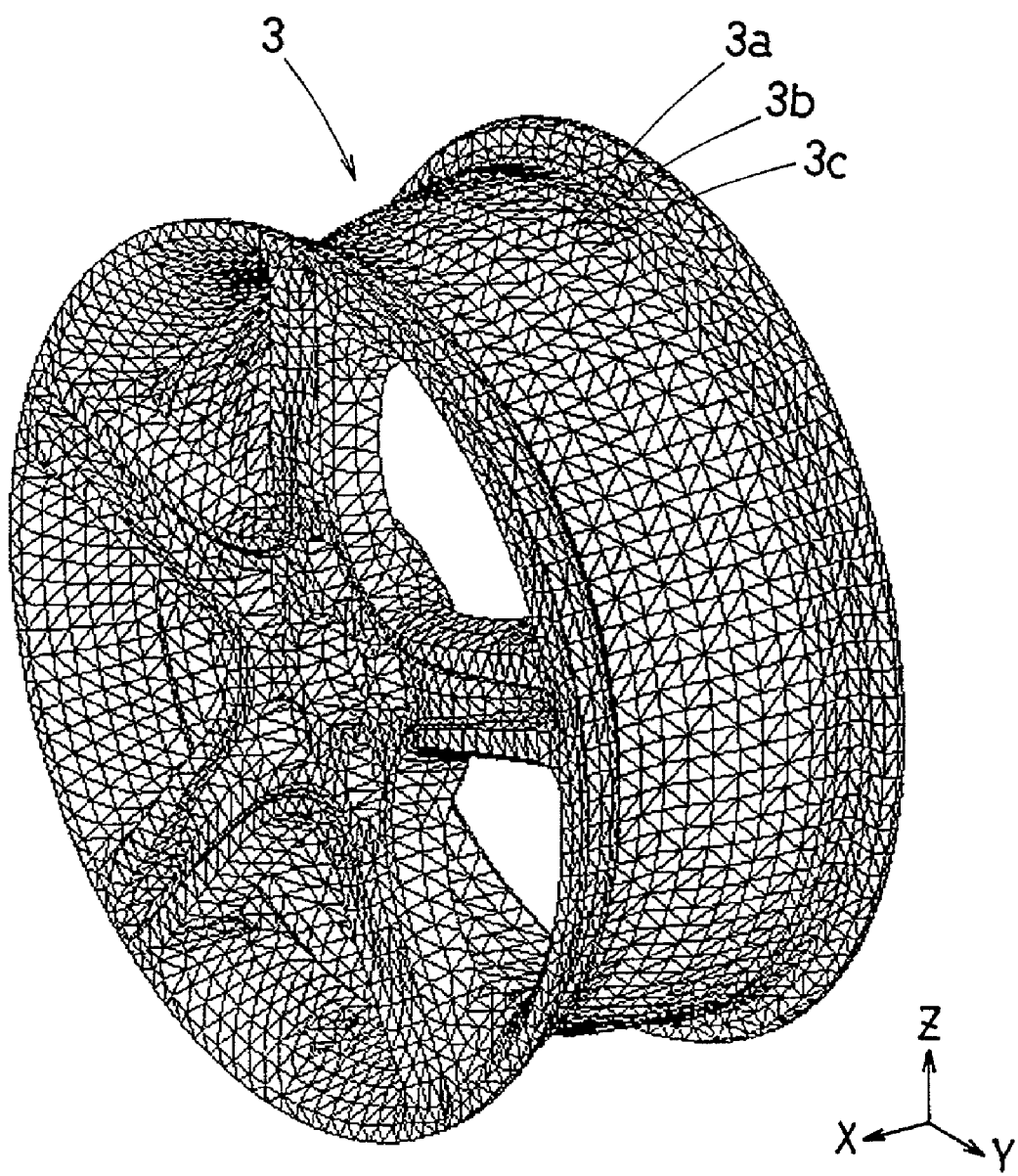
FIG. 10 shows a finite element model of the wheel.

FIG. 10 shows an exemplary wheel model 3 of the wheel Wh, wherein coordinate data relating to the finite elements 3a, 3b, 3c - - - of the wheel model 3 are visualized in a three-dimensional manner by the computer system 1.

In this example, the elements 3a, 3b, 3c - - - are tetrahedral elements, namely, three-dimensional elements. However, other elements such as pentahedral element, hexahedral element, planar shell element and the like can be also used according to the shape and structure of the wheel. In case of relatively thick wheels such as aluminum wheel, tetrahedral, pentahedral and hexahedral elements may be preferably used. FIG. 11(A) shows a part divided into tetrahedral elements Ea. FIG. 11(B) shows a part divided into hexahedral elements Eb. In case of relatively thin wheels such as steel wheel, a shell element may be used. In any case, in order to accurately simulate a state that the tire is mounted on the rim to obtain accurate data of the contact pressure distribution and the like, the bead seats Wr2 and rim flanges Wr3 have to be elaborately divided into finite elements.

In the subroutine shown in FIG. 3, the order of the process S11 for making the tire model 2 and the process S12 for making the wheel model 3 is not essential. The order may be reversed. Further, these processes can be made simultaneously.

Next, as shown in FIG. 3, the tire model 2 is mounted on the wheel model 3, namely, such a simulation (hereinafter, the "tire mounting simulation") is made by using a finite element method as a numerical analysis method. (Process S13)

In the tire mounting simulation, using the tire model 2 and wheel model 3, the motion and behavior of the tire during mounting on the wheel rim is (numerically and optionally visually) reproduced on the computer system 1 as a time-series analysis.

The tire mounting simulation can be made according to the processes S131, S132 and S133 shown in FIG. 12 for example.

In the first process S131, the tire model 2 is restrained such that mainly the sidewall portions and bead portions are deformed as shown in FIG. 13 to decrease the bead width below the rim width. In order to deform the tire model 2 like that, an axially inward force F is applied to each of the bead portions, for example to the bead core. In this process S131, with respect to each of the elements of the tire model 2, its deformation due to the axial force is computed, and the results are combined into the overall tire deformation by means of superposition. The computer system 1 can perform the computing of the overall deformation on a very-short-time-interval base and can output the results sequentially to the display 1d as visual data.

Next, the tire model 2 whose bead width is decreased as above is moved to the wheel model 3 as shown in FIG. 13. In a three-dimensional coordinate system, this process may be performed by changing the coordinate data of the tire model 2 relatively to those of the wheel model 3 so that the rotational axis CL1 of the tire model 2 coincides with the rotational axis CL2 of the wheel model 3.

Thus, a state of the tire whose bead portions are fallen into the rim well Wr1 can be simulated on the computer system 1.

When executing the simulation of putting the width-decreased tire model 2 around the wheel model 3, it is preferable to fix the position of a point of the tire, e.g. a point on the tread face in order to avoid unstable or unsteady motion of the tire model 2.

In the second process S132, the axial force F is decreased to zero to remove the deformation from the tire model 2, and the overall deformation (return motion) of the tire model 2 is computed, while satisfying contact conditions between the bead portions and the wheel model 3, more specifically, a boundary condition such that the surface of the wheel model 3 functions as a barrier restricting the motion of the bead portion, and a frictional condition between the tire model 2 and wheel model 3. Thus, in this process, the tire model released from the force F to allow its reconversion is simulated, taking the frictional force into account. The computer system 1 can perform the computing of the transformation of this reconversion on a very-short-time-interval base and can output the results sequentially to the display 1d as visual data.

In the next process S133, in order to simulate blowing up of the tire from the above-mentioned transitional state shown in FIG. 13 to or toward the normal mounted state shown in FIG. 14, the undermentioned equally distributed load is applied to the inside of the tire model 2, and the transformation of the object is computed while satisfying the contact conditions.

Given that an element surface E defined by a number (m) of nodes N is under the pressure and a force P (pressure× area) is applied to the element surface E as shown in FIG. 16, the load corresponding to the force P is equally distributed to every node N, namely, (P/m) is applied to each node. In case of FIG. 16 wherein the number (m) is four, a load which is ¼ of the force P is applied to each node N.

In order to compute the frictional force between the tire bead portions and the wheel rim bead seats 3A when the bead portions are axially outwardly moved by the application of the inner pressure, a specific frictional coefficient is defined therebetween. In case a lubricity agent is applied, a value of about 0.1 is used based on the actual value.

Similarly to the above-mentioned process S132, the computer system 1 can perform the computing of this transformation on a very-short-time-interval base and can output the results sequentially to the display 1d as visual data.

Accordingly, the process of the browning up of the tire model 2 to/toward the normal mounted state is visualized and it is possible to observe the behavior of the tire model 2. Further, it is possible through the simulation to estimate the distribution of pressure between the wheel model 3 and the tire model 2 mounted thereon, and thereby it is possible to make judgments on difficulty in mounting the tire on the wheel and the like. Thus, utilizing the data obtained by the simulation, the development of the tire bead profile and rim bead seat profile may be promoted.

If the tire model 2 is not mounted rightly on the wheel model 3 by the above-mentioned blowing pressure or force P, the force P is increased and the mounting simulation is retried.

After the tire model 2 is rightly mounted on the wheel model 3 as shown in FIG. 14, the frictional coefficient between the tire bead portion and rim bead seat is increased to a larger value, for example about 0.3, which is determined based on the actual value, thereby the simulation of tire mounting is completed and the tire/wheel assembly model 4 is made.

After the tire mounting simulation is finished, as shown in FIG. 2, a rolling simulation (process S2) is carried out using the tire/wheel assembly model 4.

FIG. 15 shows an example of the rolling simulation.

First, rolling conditions for the tire/wheel assembly model 4 are defined. (Process S21)

As the rolling conditions, for example, tire pressure, tire load, slip angle, camber angle, frictional coefficient between the tire and road surface, speed, acceleration and the like can be listed, and at least one of them is set up.

In case of the tire pressure, it can be defined as explained above in relation to the force P. In case of the tire load, for example, it can be defined as a vertical force Fs applied to the rotational axis CL2 of the wheel model 3 as shown in FIG. 18.

In case of the slip angle, as shown in FIG. 19, it can be set by inclining the undermentioned moving direction of a road surface model R at a certain angle α with respect to the center line of the tire model 2 in the widthwise direction, in other words, it can be defined as such inclination angle α.

In case of the camber angle, the tire/wheel assembly model 4 is inclined accordingly.

In case of the driving force and braking force, these are defined as a torque applied to the rotational axis CL2 of the wheel model 3 and its variation.

As to the above-mentioned road surface model R, a model of a flat smooth road surface is shown in FIG. 17(A). A model of a rough road surface is shown in FIG. 17(B). In these models, rigid planar elements Ec are used. In case of icy road, snowy road and wet road, as shown in FIG. 17(A), a fluid element (Eulerian element) Fa modeling the ice, snow and/or water is set on the road surface model R, and at the same time, a specific frictional coefficient is set up between the tire and road surface.

In the rolling simulation, the tire/wheel assembly model 4 is run on the road surface model R. In this example, to simplify the computer process, the road surface model R is moved relatively to the wheel model 3, whereby the tire model 2 contacting with the road surface model R is rotated by the frictional force. In other words, the rolling conditions are so set.

The rolling simulation is executed by the computer system 1 using a finite element method, wherein the mass matrix M, stiffness matrix K and damping matrix c of the elements are defined according to the element shapes in each model, material characteristics of each element such as mass density, Young's modulus, damping coefficient and the like, and such matrices are combined to form the matrix of the entire system to be simulated. Then, applying the above-mentioned rolling conditions, the following motion equation 1 is defined.

$$F = M\ddot{x} + C\dot{x} + Kx \qquad \text{eq.1}$$

wherein
F=external force matrix
M=mass matrix
$\ddot{x}$=acceleration matrix
C=damping matrix
$\dot{x}$=velocity matrix
K=stiffness matrix
x=displacement matrix.

The computer system 1 can execute computing of the equation 1 on a very-short-time-interval base (process S22), and can output the results sequentially to the display 1d as three-dimensional visual data. Therefore, the behaviors of the tire and wheel during rolling can be seen on the display 1d.

Next to the above-mentioned process S2, as shown in FIG. 2, data or information on the rolling tire/wheel assembly is obtained through the rolling simulation. (Process S3) The data or information is, for example, the axle force, vertical force, cornering force, the stress in each part of the wheel, self-aligning torque, vibrational force, the stress and distortion of each part of the tire, the slippage between the tire and wheel and the like. The axle force and cornering force can be utilized to estimate the steering stability. The vertical force and vibrational force can be utilized to estimate the ride comfort. The stress and distortion can be utilized in tire development and wheel development as parameters relating to the strength, ground pressure, ground contacting shape and wear energy.

FIG. 20 shows one shot of the three-dimensional motion picture showing the rolling tire/wheel assembly model 4 outputted by the computer system 1.

FIG. 21 shows a state of the tire model which undergoes a cornering force caused by setting a positive slip angle α (α≠0).

FIGS. 22, 23 and 24 show a stress distribution on the wheel model during cornering, wherein the darker the color, the larger the stress. The position and direction of the applied force or load is indicated by an arrow Q. Such estimated stress distribution about the wheel model may be utilized in order to achieve both the rigidity and a weight reduction of the wheel, such that the smaller stress part is decreased in the thickness or volume and the larger stress part is reinforced if necessary.

Next to the above-mentioned process S3, whether or not the estimated values meet the targeted values, in other words, whether or not the obtained data or information is satisfactory is decided. (Process S4)

If "No", the design factors such as materials, shapes and the like of the tire and/or wheel are changed. (Process S5) Then, the rolling simulation is again carried out. (Process S2)

If "Yes", pre-production samples are made according to the specifications of the tire model 2 and/or wheel model 3, and experimental tests are carried out. (Process S6) In the experimental tests, the performance, characteristics and the like of the actual tire and/or wheel are evaluated.

In the next process S7, whether or not the test results are satisfactory, is decided.

If "Yes", for example, it is decided to make the examination of commercial production.

If "No", the target is reexamined and if necessary the target is changed, otherwise correction of the rolling simulation is made because it is believed that there is a discrepancy between the estimation by the rolling simulation and the evaluation on the actual object. (Process S8)

In such a case, comparing the estimated data with the evaluated data, the association function therebetween is rebuilt so as to minimize the difference therebetween. Due to such feedback of the evaluation on the actual object to the estimation by the simulation, the accuracy and reliability of the next estimation can be improved.

As described above, the rolling simulation can be made in consideration of factors relating to the tire and wheel such as frictional force and slippage therebetween. Therefore, it is possible to get accurate simulation results close to the reality. Accordingly, various performances such as steering stability, straight running stability, ride comfort, wear resistance and the like can be estimated with accuracy. As the tire model is mounted on the wheel model, variations of the contact pressure, contact area and the like caused during rolling, accelerating and decelerating, and cornering can be simulated.

In the tire mounting simulation, the simulation is made while computing the frictional force between the tire and wheel. Therefore, it is possible to estimate the difficulty of tire mounting and the like. Further, the dislocation or unseating of the bead portion which may be caused by a decrease in the tire pressure can be checked out.

In this way, the method and apparatus according to the present invention will be helpful in not only development of tire and wheel but also development of lubricity agents.

For example, according to the present invention, the time for developing a pneumatic tire for a newly-developed automobile could be shortened about three to four months when compared with the average development time on a try and select base.

The invention claimed is:

1. A computer implemented method for estimating tire/wheel performance by simulation comprising
    making a tire/wheel assembly model which is a finite element model of an assembly of a wheel and a tire mounted thereon,
    simulating the tire/wheel assembly model which is rolling under a given rolling condition,
    getting an estimated data which indicates performance or a characteristic of the tire, wheel or the assembly, from the rolling simulation; wherein
    said making of the tire/wheel assembly model includes
    making a tire model which is a finite element model of the tire,
    making a wheel model which is a finite element model of the wheel, and
    combining the tire model and the wheel model into the tire/wheel assembly model through a simulation of tire mounting; and
    said simulation of tire mounting comprises
    applying a force to the tire model to deform the tire model such that a bead width of the tire model becomes less than a rim width of the wheel model,
    putting the deformed tire model around the wheel model,
    removing the applied force from the deformed tire model, and
    applying a force to the tire model as a pressure to the inside of the tire model to simulate the tire model which blows up with the bead portions contacting with the wheel model; and
    displaying the estimated performance data on a display device to develop a tire profile and/or a rim based profile.

2. The method according to claim 1, wherein
    the rolling condition is the tire pressure, tire load, slip angle and camber angle of the tire/wheel assembly, acceleration, or frictional coefficient of a road surface.

3. The method according to claim 1, wherein
    the estimated data indicates one of an axle force, vertical force, stress, deformation, distortion, and slippage between the tire model and wheel model.

4. The method according to claim 1, which further comprises
    setting up a certain frictional coefficient between the tire model and the wheel model.

5. The method of claim 1, further comprising
    utilizing the estimated data in a visual form.

6. A data processing apparatus for estimating tire/wheel performance by simulation comprising:
    means for making a tire/wheel assembly model which is a finite element model of an assembly of a wheel and a tire mounted thereon,
    means for simulating the tire/wheel assembly model which is rolling under a given rolling condition, and
    means for getting an estimated data which indicates performance or a characteristic of the tire, wheel or the assembly, from the rolling simulation; wherein said means for making a tire/wheel assembly model includes:
  means for making a tire model which is a finite element model of the tire,
  means for making a wheel model which is a finite element model of the wheel, and
  means for combining the tire model and the wheel model into the tire/wheel assembly model through a simulation of tire mounting
wherein the means for combining the tire model and the wheel model into the tire/wheel assembly model through a simulation of tire mounting comprises
  means for applying a force to the tire model to deform the tire model such that a bead width of the tire model becomes less than a rim width of the wheel model,
  means for putting the deformed tire model around the wheel model,
  means for removing the applied force from the deformed tire model, and
  means for applying a force to the tire model as a pressure to the inside of the tire model to simulate the tire model which blows up with the bead portions contacting with the wheel model; and
means for displaying the estimated data on a display device to develop a tire profile and/or a rim based profile.

7. The apparatus according to claim 6, wherein
the rolling condition is the tire pressure, tire load, slip angle and camber angle of the tire/wheel assembly, acceleration, or frictional coefficient of a road surface.

8. The apparatus according to claim 6, wherein
the estimated data indicates one of an axle force, vertical force, stress, deformation, distortion, and slippage between the tire model and the wheel model.

9. The apparatus according to claim 6, further comprising means for setting up a certain frictional coefficient between the tire model and the wheel model.

10. A method for estimating tire/wheel performance by simulation comprising
  making a tire/wheel assembly model which is a finite element model of an assembly of a wheel and a tire mounted thereon,
  simulating the tire/wheel assembly model which is rolling under a given rolling condition,
  getting an estimated data which indicates performance or a characteristic of the tire, wheel or the assembly, from the rolling simulation; wherein
  said making of the tire/wheel assembly model includes
  making a tire model which is a finite element model of the tire,
  making a wheel model which is a finite element model of the wheel, and
  combining the tire model and the wheel model into the tire/wheel assembly model through a simulation of tire mounting; and
  said simulation of tire mounting comprises
  applying a force to the tire model to deform the tire model such that a bead width of the tire model becomes less than a rim width of the wheel model,
  putting the deformed tire model around the wheel model,
  removing the applied force from the deformed tire model, and
  applying a force to the tire model as a pressure to the inside of the tire model to simulate the tire model which blows up with the bead portions contacting with the wheel model; and
  using a display device to display the estimated data to develop a tire profile and/or a rim based profile.

* * * * *